United States Patent
Chen et al.

(10) Patent No.: US 11,469,352 B2
(45) Date of Patent: Oct. 11, 2022

(54) DISPLAY DEVICE AND MANUFACTURING METHOD THEREOF

(71) Applicant: Lextar Electronics Corporation, Hsinchu (TW)

(72) Inventors: Fu-Hsin Chen, Hsinchu (TW); Yu-Chun Lee, Hsinchu (TW); Hung-Chun Tong, Hsinchu (TW); Tzong-Liang Tsai, Hsinchu (TW)

(73) Assignee: Lextar Electronics Corporation, Hsinchu (TW)

(*) Notice: Subject to any disclaimer, the term of this patent is extended or adjusted under 35 U.S.C. 154(b) by 60 days.

(21) Appl. No.: 16/698,980

(22) Filed: Nov. 28, 2019

(65) Prior Publication Data
US 2021/0135063 A1 May 6, 2021

(30) Foreign Application Priority Data

Oct. 31, 2019 (TW) ................. 108139562

(51) Int. Cl.
*H01L 33/50* (2010.01)
*H01L 33/06* (2010.01)
*H01L 25/075* (2006.01)
*H01L 33/00* (2010.01)

(52) U.S. Cl.
CPC ........ *H01L 33/504* (2013.01); *H01L 25/0753* (2013.01); *H01L 33/0095* (2013.01); *H01L 33/06* (2013.01); *H01L 2933/0041* (2013.01)

(58) Field of Classification Search
CPC .................................................. H01L 33/504
See application file for complete search history.

(56) References Cited

U.S. PATENT DOCUMENTS

| 2014/0339495 | A1 | 11/2014 | Bibl et al. | |
| 2017/0054053 | A1 | 2/2017 | Jeon et al. | |
| 2017/0133357 | A1 | 5/2017 | Kuo et al. | |
| 2018/0190871 | A1 | 7/2018 | Kim et al. | |
| 2019/0237452 | A1* | 8/2019 | Kuo | H01L 33/60 |
| 2019/0378873 | A1* | 12/2019 | Lee | H01L 33/50 |
| 2020/0144460 | A1* | 5/2020 | Onuma | G09G 3/32 |

FOREIGN PATENT DOCUMENTS

| CN | 110024484 A | 7/2019 |
| KR | 10-2011-0111090 A | 10/2011 |
| TW | 202119652 A | 5/2021 |

OTHER PUBLICATIONS

"[High-industry research and analysis] Micro LED mass transfer technology route analysis", http://read01.com/yyODJMd.html#.YWjaTBpBxhE, Advanced Industry Research Institute, Feb. 6, 2019.

* cited by examiner

*Primary Examiner* — Christopher A Johnson
(74) *Attorney, Agent, or Firm* — CKC & Partners Co., LLC

(57) ABSTRACT

A display device includes a substrate, a plurality of white light-emitting units, and a color filter layer. The white light-emitting units are arranged on the substrate at intervals, and the white light-emitting units are chip scale package (CSP). The color filter layer is above the white light-emitting units. Each of the white light-emitting units includes a light-emitting diode chip and a wavelength conversion film. The wavelength conversion film directly covers a top surface and side surfaces of the light-emitting diode chip, and the wavelength conversion film converts light emitted by the light-emitting diode chip into white light.

7 Claims, 10 Drawing Sheets

DISPLAY DEVICE AND MANUFACTURING METHOD THEREOF

RELATED APPLICATIONS

This application claims priority to Taiwan Application Ser. No. 108139562, filed Oct. 31, 2019, which is herein incorporated by reference.

BACKGROUND

Field of Invention

The present disclosure relates to a display device and a method of manufacturing the display device.

Description of Related Art

Light-emitting diodes (LEDs) are widely used in illuminating, backlights, and light-emitting diode displays because of their long life, low power consumption, and simple driving. In general, a light-emitting diode display often uses a red, green, and blue light-emitting diode chips as a pixel, and the pixels are arranged to form a full-color light-emitting diode display.

However, such a light-emitting diode display often faces problems such as uneven illumination, electrical controlling difficulties, inability to reduce size, and high manufacturing cost. Therefore, how to effectively solve the above problems is an urgent issue to be resolved.

SUMMARY

The disclosure relates in general to a display device and a manufacturing method thereof.

According to an embodiment of the present disclosure, the display device includes a substrate, a plurality of white light-emitting units, and a color filter layer. The white light-emitting units are arranged on the substrate at intervals, and the white light-emitting units are chip scale package (CSP). The color filter layer is above the white-light emitting units. Each of the white light-emitting units includes a light-emitting diode chip and a wavelength conversion film. The wavelength conversion film directly covers a top surface and side surfaces of the light-emitting diode chip, and the wavelength conversion film converts light emitted by the light-emitting diode chip into white light.

In an embodiment of the present disclosure, the color filter layer includes a plurality of color resists, each of the color resists is a red color resist, a green color resist or a blue color resist, and the color resists respectively correspond to the white light-emitting units.

In an embodiment of the present disclosure, the color filter layer further includes a black matrix between the color resists.

In an embodiment of the present disclosure, the light-emitting diode chip emits blue light.

In an embodiment of the present disclosure, the wavelength conversion film includes a plurality of first quantum dots and a plurality of second quantum dots, and a wavelength range of light excited from the first quantum dots are different from a wavelength range of light excited from the second quantum dots.

In an embodiment of the present disclosure, the light-emitting diode chip is a light-emitting diode chip without substrate, and a thickness of the light-emitting diode chip is in a range from about 5 μm to about 10 μm.

In an embodiment of the present disclosure, a thickness of the color filter layer is in a range from about 3 μm to about 100 μm.

According to an embodiment of the present disclosure, the method of manufacturing the display device includes: forming a plurality of chip-scale packaged white light-emitting units on a carrier; transferring any number of the chip-scale packaged white light-emitting units onto a substrate; and disposing a color filter layer over the chip-scale packaged white light-emitting units.

In an embodiment of the present disclosure, forming the chip-scale packaged white light-emitting units on the carrier includes: disposing a plurality of light-emitting diode chips without substrate on the carrier in a flip-chip manner; and forming a plurality of wavelength conversion films over the carrier to cover a top surface and side surfaces of each of the light-emitting diode chips through lamination, such that the wavelength conversion films and the light-emitting diode chips have a same profile, in which the wavelength conversion films interconnects with each other between the light-emitting diode chips.

In an embodiment of the present disclosure, transferring any number of the chip-scale packaged white light-emitting units onto the substrate includes: absorbing the chip-scale packaged white light-emitting units, such that the wavelength conversion films disconnect with each other between the light-emitting diode chips; and adhering the chip-scale packaged white light-emitting units onto the substrate.

In the aforementioned embodiments of the present disclosure, since the wavelength conversion film directly covers the top surface and the side surfaces of the light-emitting diode chip to form a white light-emitting unit with chip scale package (CSP), an overall thickness of the display device can be reduced. In addition, the white light-emitting units are matched with the color filter layer to obtain light of various colors, which can improve the uniformity of illumination of the display device and solve the problem of electrical controlling difficulties. Furthermore, a usage amount of material of the wavelength conversion film can be reduced by directly disposing the chip-scale packaged white light-emitting units on the substrate, and hence reduces the production cost.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
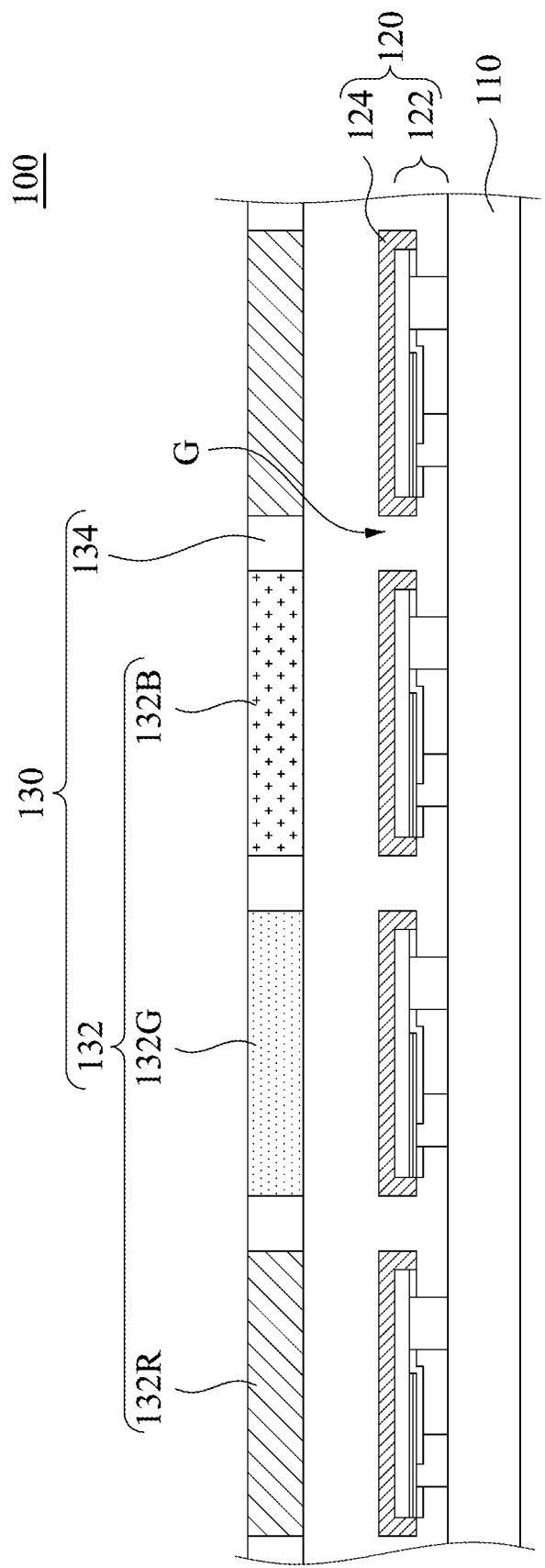
FIG. 1 is a side view of a display device according to an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
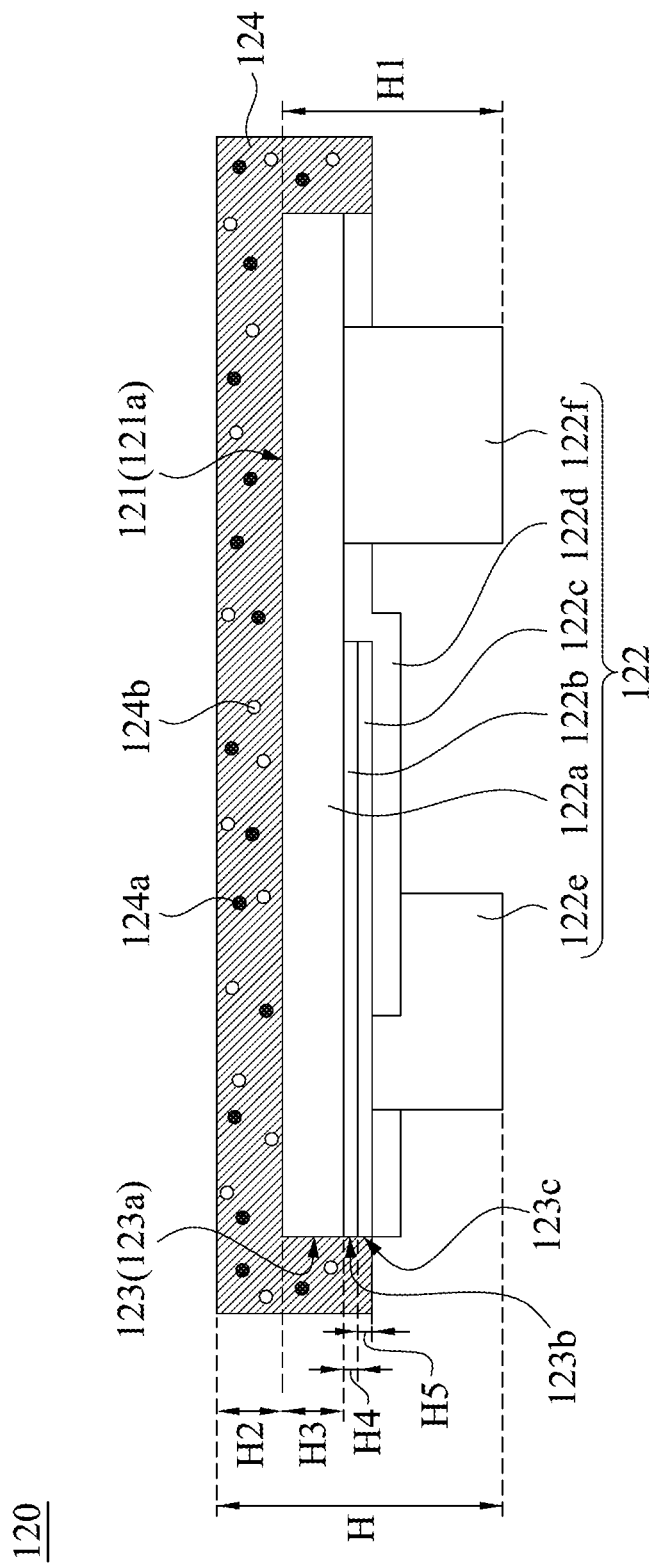
FIG. 2 is a side view of the white light-emitting unit shown in FIG. 1.

FIG. 1 is a side view of a display device 100 according to an embodiment of the present disclosure. FIG. 2 is a side view of the white light-emitting unit 120 shown in FIG. 1. Reference is made to FIG. 1 and FIG. 2. The display device 100 includes a substrate 110, a plurality of white light-emitting units 120, and a color filter layer 130. The substrate 110 may be a substrate having conductive traces, such as a thin film transistor substrate, a glass substrate, a quartz substrate, or a silicon substrate, but the present disclosure is not limited in this regard. The white light-emitting units 120 are arranged on the substrate 110 at intervals, that is, gaps G are between the white light-emitting units 120. Furthermore, the color filter layer 130 is disposed over the white light-emitting units 120.

In some embodiments, each of the white light-emitting units 120 includes a light-emitting diode chip 122 and a wavelength conversion film 124. The white light-emitting unit 120 is chip scale package (CSP), that is, the wavelength conversion film 124 directly covers a top surface 121 and side surfaces 123 of the light-emitting diode chip 122. Additionally, the light-emitting diode chip 122 is a light-emitting diode chip without substrate, for example, the light-emitting diode chip 122 has no sapphire substrate, such that an overall size of the white light-emitting unit 120 is reduced. For example, a thickness H of the white light-emitting unit 120 including the light-emitting diode chip 122 without substrate is in a range from about 8 μm to about 110 μm, in which a thickness H1 of the light-emitting diode chip 122 is in a range from about 5 μm to about 10 μm, and a thickness H2 of the wavelength conversion film 124 is in a range from about 3 μm to about 100 μm. Since the white light-emitting unit 120 has a smaller size to be arranged in a high-density manner, the display device 100 is able to have a good uniformity of illumination.

In some embodiments, the light-emitting diode chip 122 includes an n-type semiconductor layer 122a, a luminous layer 122b, a p-type semiconductor layer 122c, a protecting layer 122d, a positive electrode 122e, and a negative electrode 122f. In detail, the luminous layer 122b is between the n-type semiconductor layer 122a and the p-type semiconductor layer 122c, and the wavelength conversion film 124 covers a top surface 121a and side surfaces 123a of the n-type semiconductor layer 122a, side surfaces 123b of the luminous layer 122b, and side surfaces 123c of the p-type semiconductor layer 122c. In some embodiments, the n-type semiconductor layer 122a is an n-type gallium nitride semiconductor layer, and the p-type semiconductor layer 122c is a p-type gallium nitride semiconductor layer. A thickness H3 of the n-type semiconductor layer 122a is in a range from about 2.0 μm to about 3.5 μm, and a thickness H5 of the p-type semiconductor layer 122c is about 0.17 μm. Furthermore, a thickness H4 of the luminous layer 122b is in a range from about 0.05 μm to about 0.09 μm. Additionally, the positive electrode 122e and the negative electrode 122f may be made of a material including metal or alloy, but the present disclosure is not limited in this regard.

In some embodiments, the light-emitting diode chip 122 generates blue light, and the wavelength conversion film 124 converts the blue light generated by the light-emitting diode chip 122 into white light, such that the white light-emitting unit 120 can emit white light. For example, the wavelength conversion film 124 may include a plurality of first quantum dots 124a and a plurality of second quantum dots 124b. The first quantum dots 124a convert the blue light generated by the light-emitting diode chip 122 into red light, and the second quantum dots 124b convert the blue light generated by the light-emitting diode chip 122 into green light. Subsequently, the red light, the green light, and the blue light which has not been converted by quantum dots are mixed into white light and emitted by the white light-emitting unit 120. In other embodiments, the light-emitting diode chip 122 may also generate light of other colors, and the first quantum dots 124a and the second quantum dots 124b in the wavelength conversion film 124 respectively convert the color light into light of different wavelength ranges, which are further mixed into white light and emitted by the white light-emitting unit 120. In other words, each of the white-light emitting units 120 is a chip scale package (CSP), and each of the chip scale packages can emit white light.

Since each of the white-light emitting units 120 can emit white light, electrical controlling problems can be avoided. In detail, the conventional display device includes a plurality of red, green, and blue light-emitting units, and since a voltage difference is between each of the light-emitting units, the electrical properties of the display device are not easily controlled. However, the display device 100 of the present disclosure directly includes a plurality of white light-emitting units 120, such that the above-mentioned electrical controlling problems caused by the voltage difference are prevented.

Figure 3:
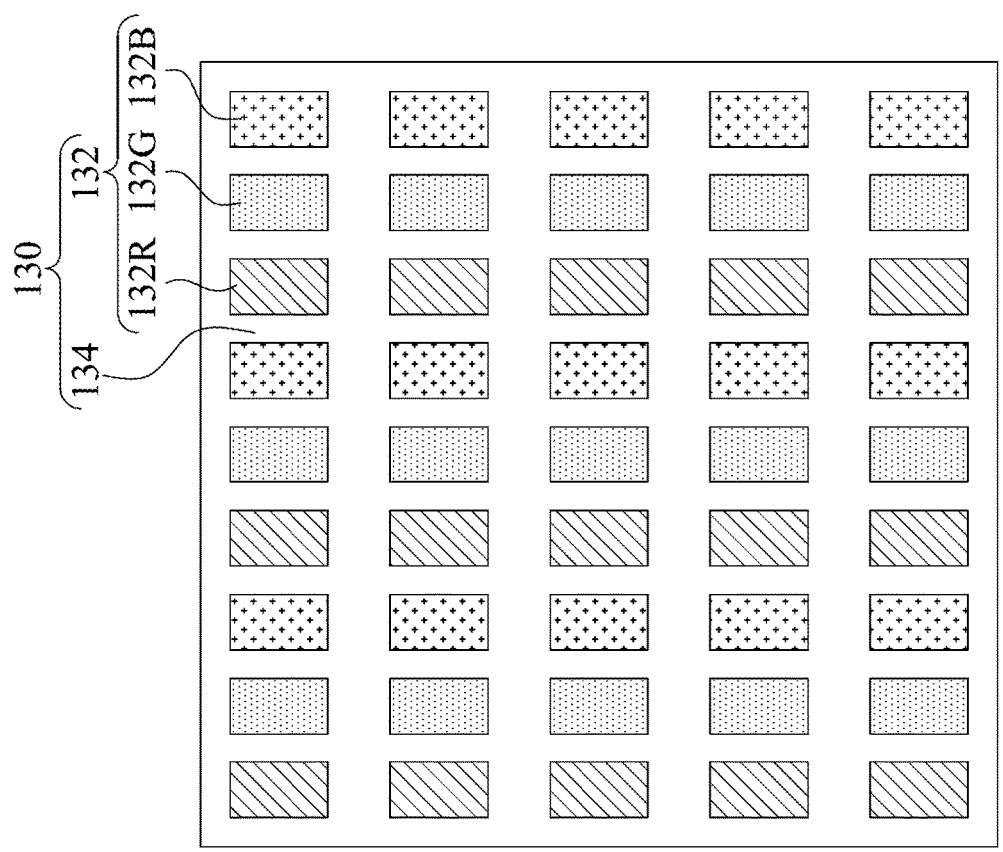
FIG. 3 is a top view of the display device shown in FIG. 1.

FIG. 3 is a top view of the display device 100 shown in FIG. 1. Reference is made to FIG. 1 and FIG. 3. The color filter layer 130 includes a plurality of color resists 132, and each of the color resists 132 may be a red color resist 132R, a green color resist 132G, or a blue color resist 132B. Each of the color resists 132 corresponds to a different white light-emitting unit 120. As such, each of the color resists 132 can convert the white light emitted by the corresponding white-light emitting unit 120 into light of a corresponding color, for example, red light, green light or blue light. In some embodiments, the color resists 132 may be arranged in an array. In other embodiments, the red color resist 132R, the green color resist 132G, and the blue color resist 132B may be adjacently arranged to form a pixel unit. However, the arrangement of the color resists 132 is not limited in this regard, and may be determined as deemed necessary by designers. In addition, the color filter layer 130 further includes a black matrix 134 between the color resists 132. The black matrix 134 has good light shielding properties to avoid light leakage between the color resists 132 or the pixel units, thereby improving the contrast presented by the display device 100.

Since the display device 100 obtain light of various colors through the combination of the white light-emitting units 120 and the color filter layer 130, and each of the white-light emitting units 120 corresponds to one color resist 132, distinct bright and dark areas are not easily produced regardless of the angle or manner in which the white light-emitting units 120 are arranged, thereby improving the uniformity of illumination of the display device 100. In addition, the corresponding color light can be generated without affecting the color resolution by applying a high-resolution color filter layer 130 matching the different color resists 132 to the different white light-emitting units 120.

It is to be noted that the connection relationships and the advantages of the elements described above will not be repeated. In the following description, a method of manufacturing the display device 100 will be discussed.

Figure 4:
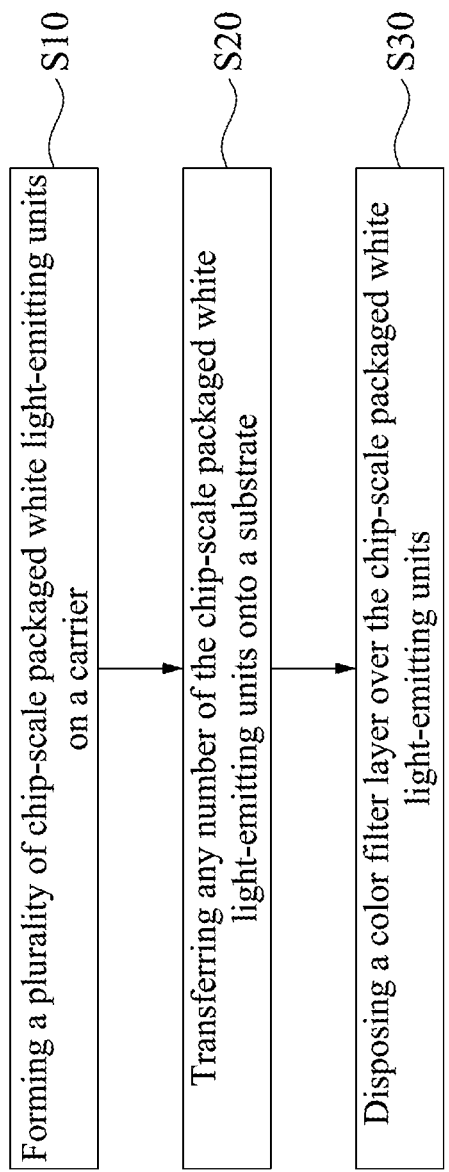
FIG. 4 is flow diagram of a method of manufacturing a display device according to an embodiment of the present disclosure.

FIG. 4 is flow diagram of the method of manufacturing the display device 100 according to an embodiment of the present disclosure. The method of manufacturing the display device 100 includes the following steps. In step S10, a plurality of chip-scale packaged white light-emitting units are formed on a carrier. In step S20, any number of the white light-emitting units is transferred onto a substrate. In step S30, a color filter layer is disposed over the chip-scale packaged white light-emitting units.

Figure 5:
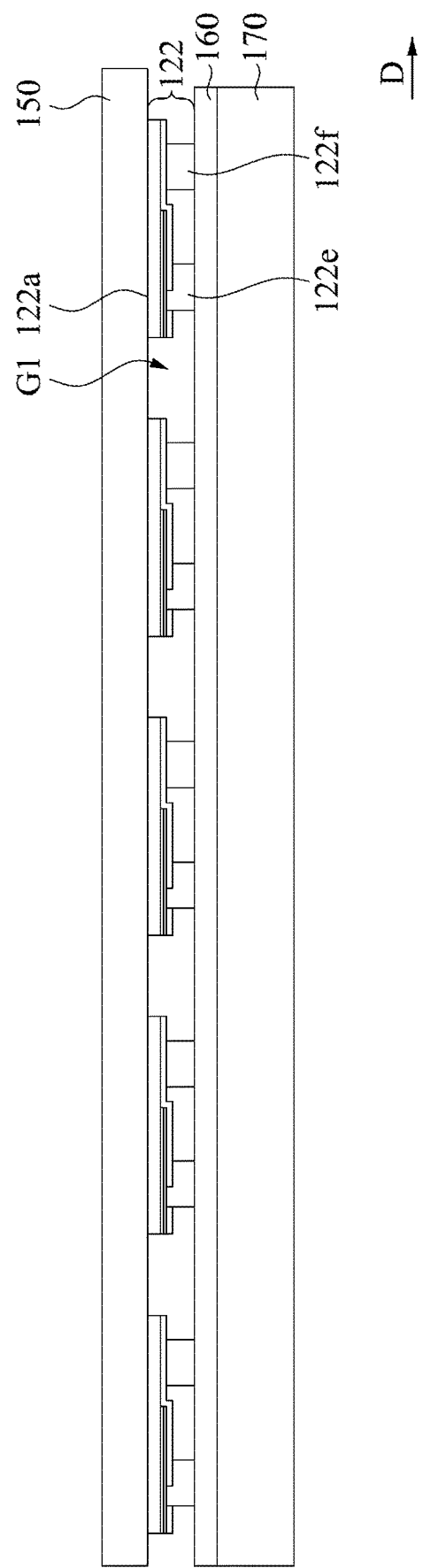
FIGS. 5-10 are cross-sectional views of a process at various stages of a method of manufacturing a display device according to an embodiment of the present disclosure.

FIG. 5 is a cross-sectional view of a process at specific stages of the method of manufacturing the display device 100 according to an embodiment of the present disclosure. First, a plurality of light-emitting diode chips 122 are formed on a substrate 150 (e.g., a sapphire substrate), such that the light-emitting diode chips 122 are arranged along an extending direction D of the substrate 150, and gaps G1 are between the light-emitting diode chips 122. Next, the light-emitting diode chips 122 with the substrate 150 are placed upside down and placed on a carrier 170 through an adhesive layer 160. In other words, this step is to place the light-emitting diode chips 122 with the substrate 150 on the carrier 170 in a flip-chip manner. In detail, an n-type semiconductor layers 122a of the light-emitting diode chips 122 are attached to the substrate 150, and positive electrodes 122e and negative electrodes 122f of the light-emitting diode chips 122 are adhered to the carrier 170 through the adhesive layer 160, such that the substrate 150 and the carrier 170 are located on opposite sides of the light-emitting diode chips 122.

Figure 6:
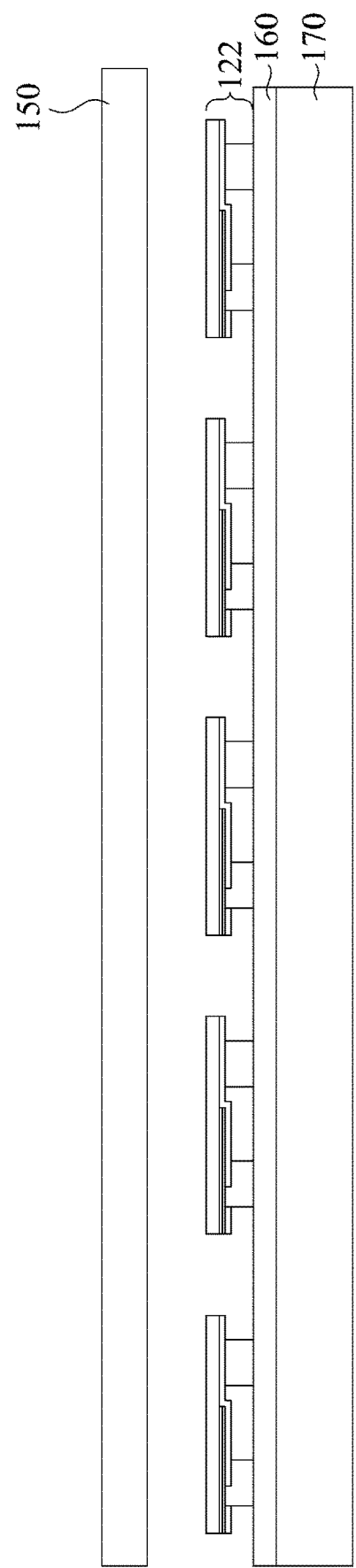

FIG. 6 is a cross-sectional view of a process at specific stages of the method of manufacturing the display device 100 according to an embodiment of the present disclosure. After the light-emitting diode chips 122 are placed on the carrier 170, the substrate 150 on the light-emitting diode chips 122 is subsequently removed. As a result, a plurality of light-emitting diode chips 122 without substrate are disposed on the carrier 170. In some embodiments, the substrate 150 can be removed through laser lift-off (LLO), but the present disclosure is not limited in this regard. By removing the substrate 150, a thickness of the subsequently formed white light-emitting units can be small to effectively reduce the overall size of the display device 100.

Figure 7:
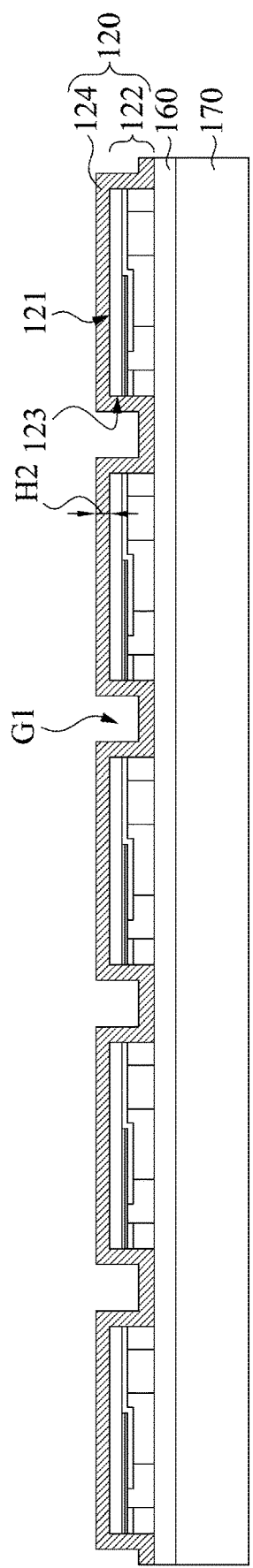

FIG. 7 is a cross-sectional view of a process at step S10 of the method of manufacturing the display device 100 according to an embodiment of the present disclosure. In step S10, the wavelength conversion films 124 are formed over the carrier 170 through lamination to cover the top surface 121 and the side surfaces 123 of each of the light-emitting diode chips 122, such that the wavelength conversion films 124 and the light-emitting diode chips 122 have a same profile. The wavelength conversion films 124 are connected to each other between the light-emitting diode chips 122, and the connected portions are adhered to the adhesive layer 160. In detail, since the wavelength conversion films 124 have a small thickness H2, the gaps G1 between the adjacent light-emitting diode chips 122 are not filled with the wavelength conversion films 124. By covering the light-emitting diode chips 122 with the wavelength conversion films 124 having a small thickness H2, the usage amount of material of the wavelength conversion films 124 can be reduced, thereby reducing the production cost and the overall size of the display device 100. In this step, the wavelength conversion film 124 and the light-emitting diode chip 122 covered therein may be regarded as a chip-scale packaged white light-emitting unit 120. In other words, in this step, a plurality of chip-scale packaged white light-emitting units 120 are disposed on the carrier 170.

Figure 8:
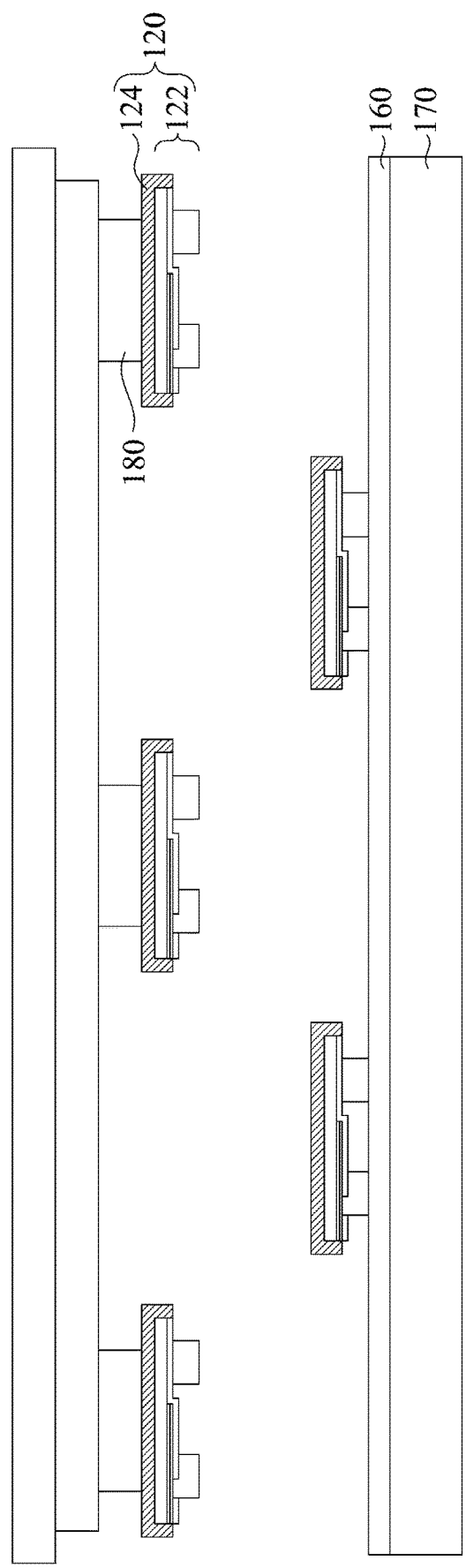

FIG. 8 is a cross-sectional view of a process at step S20 of the method of manufacturing the display device 100 according to an embodiment of the present disclosure. In step S20, any number of the white light-emitting units 120 on the carrier 170 is adsorbed, such that the wavelength conversion films 124 are disconnected from each other between the light-emitting diode chips 122. In some embodiments, the white light-emitting units 120 on the carrier 170 can be selectively adsorbed by transposition heads 180 (e.g., a poly(dimethyl siloxane) transposition head) through micro-transfer printing (μTP). In detail, in this step, the white light-emitting units 120 are adsorbed through the Van der Waals force between the transposition heads 180 and the wavelength conversion films 124.

Figure 9:
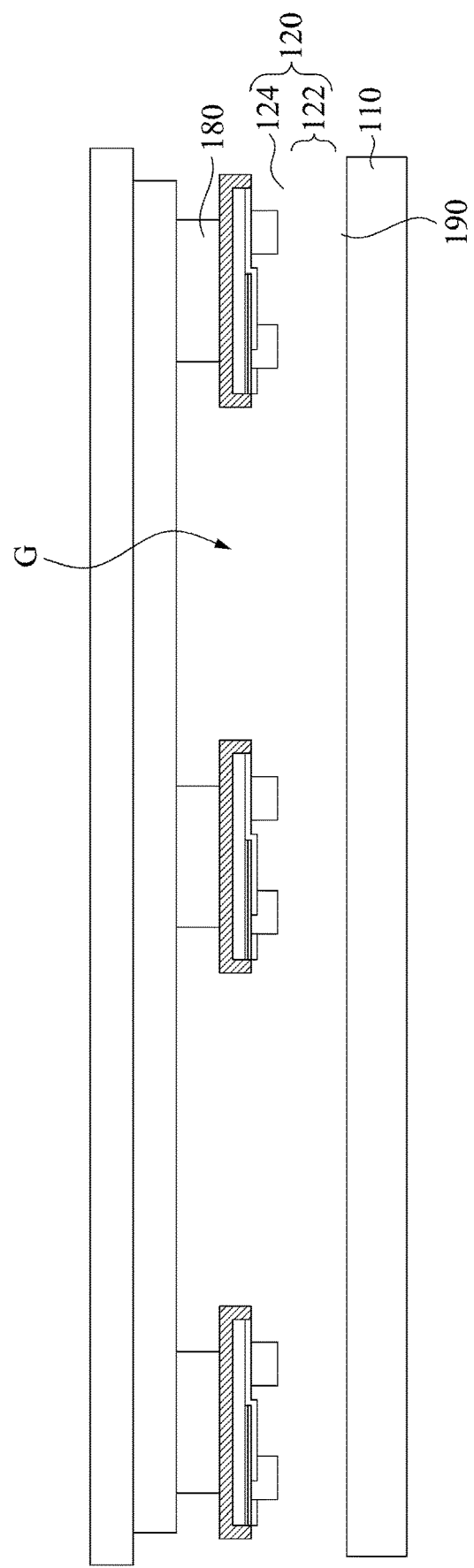

FIG. 9 is a cross-sectional view of a process at step S20 of the method of manufacturing the display device 100 according to an embodiment of the present disclosure. Step S20 is continuously performed. After the white-light emitting units 120 are placed on the carrier 170, the white light-emitting units 120 adsorbed to the transposition heads 180 are transferred to a corresponding position of the substrate 110. In some embodiments, the white light-emitting units 120 may be adhered to the substrate 110 by eutectic soldering. In other embodiments, the white light-emitting units 120 may be adhered to the substrate 110 by solder paste reflowing. As such, conductive features 190 can be formed to stick the white light-emitting units 120 to the substrate 110. In step S20, the white light-emitting units 120 on the carrier 170 can be selectively adsorbed in accordance with the position on the substrate 110 where the white light-emitting units 120 are to be placed. In some embodiments, gaps G are between the white light-emitting units 120.

Figure 10:
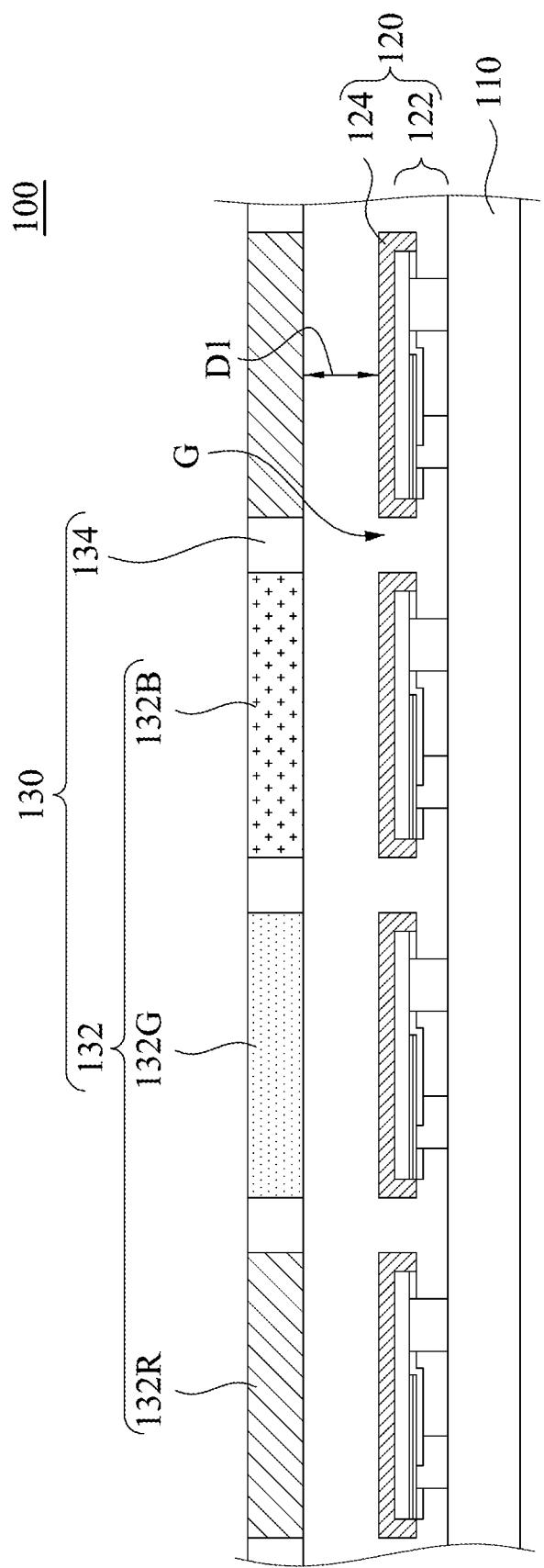

FIG. 10 is a cross-sectional view of a process at step S30 of the method of manufacturing the display device 100 according to an embodiment of the present disclosure. In step S30, the color filter layer 130 is disposed above the white light-emitting units 120, and each of the color resists 132 of the color filter layer 130 is corresponded to a different white light-emitting unit 120. It is noted that the conductive features 190 are omitted in FIG. 10 for clarity. Since the white light-emitting units 120 including the wavelength conversion films 124 are directly disposed on the substrate 110 in step S20, there's no need for additionally providing other wavelength conversion layers between the color filter layer 130 and the white light-emitting units 120, such that a distance D1 between the color filter layer 130 and the white light-emitting units 120 is reduced, thereby reducing the overall size of the display device 100.

According to the aforementioned embodiments of the present disclosure, since the wavelength conversion films directly cover the top surfaces and the side surfaces of the light-emitting diode chips to form the white light-emitting units with chip scale package, the overall thickness of the display device can be reduced. In addition, the white light-emitting units are matched with the color filter layer to obtain light of various colors, which can improve the uniformity of illumination of the display device and solve the problem of electrical controlling difficulties. Furthermore, the usage amount of the material of the wavelength conversion films can be reduced by directly disposing the chip-scale packaged white light-emitting units on the substrate, and hence reduces the production cost.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A display device, comprising:

a substrate;

a plurality of white light-emitting units arranged on the substrate at intervals, wherein the white light-emitting units are chip scale package (CSP), and each of the white light-emitting units comprises:

a light-emitting diode chip comprising a n-type semiconductor layer, a p-type semiconductor layer, a luminous layer disposed between the n-type semiconductor layer and the p-type semiconductor layer, a positive electrode disposed between the p-type semiconductor layer and the substrate and being in contact with the substrate, and a negative electrode disposed between the n-type semiconductor layer and the substrate and being in contact with the substrate; and a wavelength conversion film directly covering and contacting with a top surface and side surfaces of the n-type semiconductor layer of the light-emitting diode chip, and the wavelength conversion is in direct contact with a side surface of the p-type semiconductor layer such that the wavelength conversion film and the light-emitting diode chip have a same profile, and the wavelength conversion film converts light emitted by the light-emitting diode chip into white light; and a color filter layer above the white light-emitting units comprising a plurality of color resists, wherein the color resists correspond to the white light-emitting units respectively to form a plurality of pixel units.

2. The display device of claim 1, wherein each of the color resists is a red color resist, a green color resist or a blue color resist.

3. The display device of claim 2, wherein the color filter layer further comprises a black matrix between the color resists.

4. The display device of claim 1, wherein the light-emitting diode chip emits blue light.

5. The display device of claim 1, wherein the wavelength conversion film comprises a plurality of first quantum dots and a plurality of second quantum dots, and a wavelength range of light excited from the first quantum dots are different from a wavelength range of light excited from the second quantum dots.

6. The display device of claim 1, wherein the light-emitting diode chip is a light-emitting diode chip without substrate, and a thickness of the light-emitting diode chip is in a range from about 5 μm to about 10 μm.

7. The display device of claim 1, wherein a thickness of the color filter layer is in a range from about 3 μm to about 100 μm.

* * * * *